(12) United States Patent
Tan et al.

(10) Patent No.: US 6,339,021 B1
(45) Date of Patent: Jan. 15, 2002

(54) METHODS FOR EFFECTIVE NICKEL SILICIDE FORMATION

(75) Inventors: Wee Leng Tan; Kin Leong Pey; Simon Chooi, all of Singapore (SG)

(73) Assignee: Chartered Semiconductor Manufacturing Ltd., Singapore (SG)

(*) Notice: Subject to any disclaimer, the term of this patent is extended or adjusted under 35 U.S.C. 154(b) by 0 days.

(21) Appl. No.: 09/850,992

(22) Filed: May 9, 2001

(51) Int. Cl.[7] ............................................. H01L 21/44
(52) U.S. Cl. ........................ 438/655; 438/656; 438/682
(58) Field of Search ................................ 438/655, 656, 438/664, 682, 683, 685

(56) References Cited

U.S. PATENT DOCUMENTS

| | | | |
|---|---|---|---|
| 5,075,259 A | 12/1991 | Moran | 437/230 |
| 5,773,329 A | 6/1998 | Kuo | 438/162 |
| 5,840,626 A * | 11/1998 | Ohguro | 438/649 |
| 6,037,254 A | 3/2000 | Hong | 438/651 |
| 6,066,547 A | 5/2000 | Maekawa | 438/486 |
| 6,127,249 A * | 10/2000 | Hu | 438/583 |
| 6,180,469 B1 * | 1/2001 | Pramanick et al. | 438/299 |
| 6,225,202 B1 * | 5/2001 | Gupta et al. | 438/586 |
| 6,268,255 B1 * | 7/2001 | Besser et al. | 438/303 |

* cited by examiner

*Primary Examiner*—Alexander G. Ghyka
(74) *Attorney, Agent, or Firm*—George O. Saile; Rosemary L. S. Pike

(57) ABSTRACT

Methods for forming a high quality nickel silicide film in the fabrication of an integrated circuit are described. A semiconductor substrate is provided having silicon regions to be silicided wherein a native oxide layer forms on the silicon regions. A nickel layer is deposited overlying the silicon regions to be silicided. A titanium layer is deposited overlying the nickel layer. The substrate is annealed whereby titanium atoms from the titanium layer diffuse through the nickel layer and react with the native oxide layer and whereby the nickel is transformed to nickel silicide where it overlies the silicon regions and wherein the nickel not overlying the silicon regions is unreacted. In an alternative method, a titanium nitride layer over the titanium layer traps atmospheric oxygen freeing all of the titanium in the titanium layer to react with the underlying native oxide. The unreacted nickel layer is removed to complete formation of a nickel silicide film in the manufacture of an integrated circuit. In another method, a monolayer of titanium is deposited by atomic layer chemical vapor deposition underlying the nickel layer. The substrate is annealed whereby titanium atoms from the titanium monolayer react with the native oxide layer and whereby the the nickel is transformed to nickel silicide.

22 Claims, 4 Drawing Sheets

METHODS FOR EFFECTIVE NICKEL SILICIDE FORMATION

BACKGROUND OF THE INVENTION (1) Field of the Invention

The invention relates to the fabrication of integrated circuit devices, and more particularly, to a method of forming high quality nickel silicide in the fabrication of integrated circuits.

(2) Description of the Prior Art

The major factors that effect the formation of nickel silicide include the presence of native oxide, the cleanliness of the silicon surface, and the presence of oxygen during rapid thermal annealing (RTA). In manufacturing, the major hindrance to forming a high quality nickel silicide is the presence of native oxide. For example, device wafers on queue for nickel deposition may encounter delays from the unexpected malfunction of the nickel deposition equipment. These delays allow for the growth of native oxide on the silicon surface. Unlike titanium, nickel is unable to reduce oxide on the substrate surface. Therefore, the native oxide will act as a diffusion barrier, preventing the diffusion of nickel into the silicon to form nickel silicide. It is desired to find a method to remove the native oxide before nickel silicidation.

A number of patents teach nickel silicidation. U.S. Pat. No. 6,037,254 to Hong discloses a protective oxide layer to prevent alteration of contaminants on a silicon surface before deposition of a nickel layer. U.S. Pat. No. 6,066,547 to Maekawa, U.S. Pat. No. 5,075,259 to Moran, and U.S. Pat. No. 5,773,329 to Kuo teach various silicide processes.

SUMMARY OF THE INVENTION

A principal object of the present invention is to provide an effective and very manufacturable method of fabricating a nickel silicide film in the fabrication of an integrated circuit.

A further object of the invention is to provide a method of avoiding native oxide contamination while fabricating a nickel silicide film in the fabrication of an integrated circuit.

Yet another object is to provide a method of removing native oxide in the process of forming a nickel silicide film.

Yet another object is to provide a method of removing native oxide with a titanium capping layer in the process of forming a nickel silicide film.

A further object is to provide a method of removing native oxide with a titanium/titanium nitride capping layer in the process of forming a nickel silicide film.

A still further object of the invention is to provide a method of removing native oxide with an atomic layer of titanium underlying nickel in the process of forming a nickel silicide film.

Another still further object of the invention is to provide a method of removing native oxide with an atomic layer of titanium underlying nickel and a capping titanium nitride layer in the process of forming a nickel silicide film.

In accordance with the objects of the invention a novel method for forming a high quality nickel silicide film in the fabrication of an integrated circuit is achieved. A semiconductor substrate is provided having silicon regions to be silicided wherein a native oxide layer forms on the silicon regions. A nickel layer is deposited overlying the silicon regions to be silicided. A titanium layer is deposited overlying the nickel layer. The substrate is annealed whereby titanium atoms from the titanium layer diffuse through the nickel layer and react with the native oxide layer and whereby the nickel is transformed to nickel silicide where it overlies the silicon regions and wherein the nickel not overlying the silicon regions is unreacted. In an alternative method, a titanium nitride layer over the titanium layer traps atmospheric oxygen freeing all of the titanium in the titanium layer to react with the underlying native oxide. The unreacted nickel layer is removed to complete formation of a nickel silicide film in the manufacture of an integrated circuit.

Also in accordance with the objects of the invention, another novel method for forming a high quality nickel silicide film in the fabrication of an integrated circuit is achieved. A semiconductor substrate is provided having silicon regions to be silicided wherein a native oxide layer forms on the silicon regions. A monolayer of titanium is deposited by atomic layer chemical vapor deposition overlying the silicon regions to be silicided. A nickel layer is deposited overlying the titanium monolayer. The substrate is annealed whereby titanium atoms from the titanium monolayer react with the native oxide layer and whereby the nickel is transformed to nickel silicide where it overlies the silicon regions and wherein the nickel not overlying the silicon regions is unreacted. In an alternative method, a titanium nitride layer over the nickel layer traps atmospheric oxygen. The unreacted nickel layer is removed to complete formation of a nickel silicide film in the manufacture of an integrated circuit.

BRIEF DESCRIPTION OF THE DRAWINGS

In the accompanying drawings forming a material part of this description, there is shown.

DESCRIPTION OF THE PREFERRED EMBODIMENTS

The process of the present invention can be used in any application in which it is desired to form a nickel silicide film overlying a silicon region. The process of the invention will be described for the application in which a nickel silicide is formed overlying a gate electrode and source and drain regions. It is to be understood that the invention is not limited to the application so illustrated.

Figure 1:
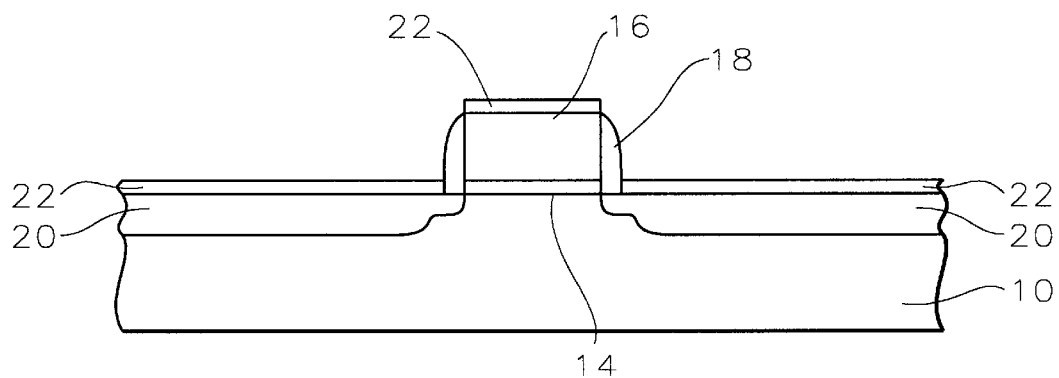
FIGS. 1 through 3 schematically illustrate in cross-sectional representation a first preferred embodiment of the present invention.

Referring now more particularly to FIG. 1, there is shown an illustration of a portion of a partially completed integrated circuit. The semiconductor substrate 10 is preferably composed of silicon having a (100) crystallographic orientation. Gate electrodes 16 and source and drain regions 20 are formed in and on the semiconductor substrate as is conventional in the art. For example, gate electrode 16 has been formed overlying a gate oxide layer 14. Sidewall spacers, such as silicon oxide or silicon nitride, 18 are formed on the gate. Source and drain regions are ntype or p-type, depending on the type of device to be fabricated.

Native oxide layer 22 forms spontaneously on the silicon surfaces. The native oxide layer may have a thickness of between about 10 and 30 Angstroms. If this native oxide layer is allowed to remain under the to-beformed nickel silicide, the native oxide will prevent nickel from reacting with the silicon during annealing, thus preventing formation of nickel silicide.

Figure 2:
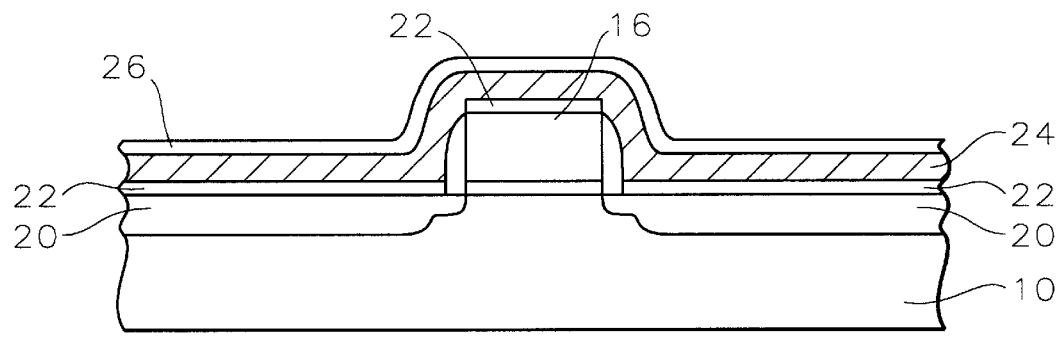

In a first preferred embodiment of the present invention, as shown in FIG. 2, a layer of nickel is deposited by physical vapor deposition (PVD) over the surface of the substrate and overlying the gate electrode. The nickel layer 24 has a thickness of between about 100 and 500 Angstroms, depending on the thickness of the NiSi required. Note that the native oxide layer 22 underlies the nickel layer. The native oxide layer thickness has been greatly exaggerated in the drawings for clarity.

Figure 3:
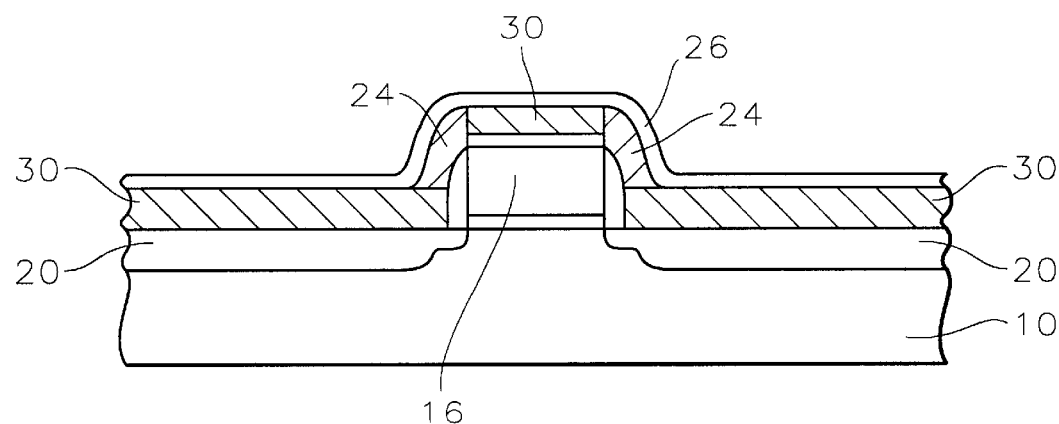

Now, a titanium layer 26 is deposited over the nickel layer 24 by PVD or CVD to a thickness of between about 55 and 200 Angstroms. The wafer is annealed using rapid thermal annealing (RTA) at a temperature of between about 450 and 650° C., and preferably 550 to 600° C. The annealing will form nickel silicide 30 over the gate electrode and over the source and drain regions, as shown in FIG. 3. The nickel overlying the sidewall spacers 18 is unreacted.

Prior to and during the RTA, some of the titanium in the capping layer 26 will react with oxygen in the air to form titanium oxide. In addition, during the RTA, the titanium will diffuse through the nickel to react with the native oxide 22 to form titanium oxide, $TiO_2$ or TiO. The titanium oxide forms a membrane that allows nickel diffusion towards silicon, after which NiSi is formed. The titanium oxide is then pushed up to the surface by the NiSi formation.

The temperature of the RTA is chosen so as to form NiSi, but not $NiSi_2$, $TiSi_2$, or $NiTi_xSi_y$. $NiSi_2$ has a high sheet resistance and so is undesirable.

Figure 4:
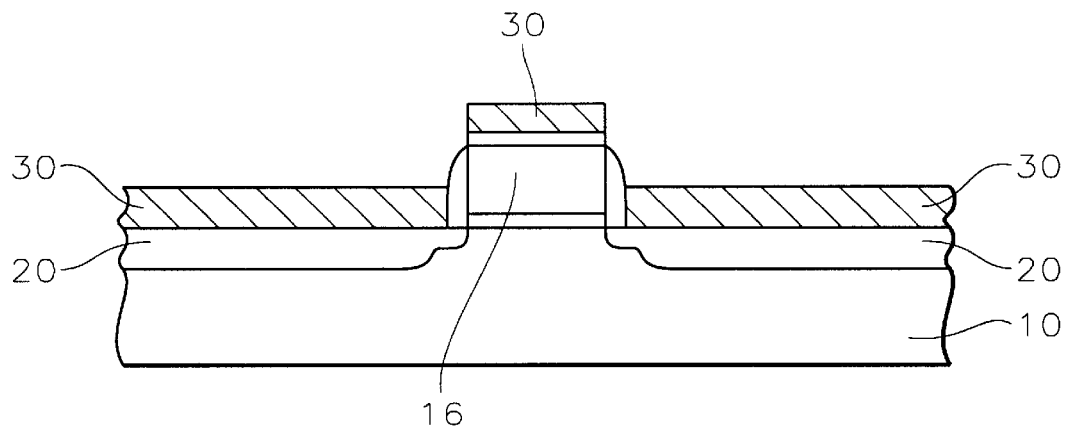
FIG. 4 schematically illustrates in crosssectional representation completed nickel silicidation in the process of the present invention.

Referring now to FIG. 4, the unreacted nickel 24 and the titanium/titanium oxide capping layer 26 are stripped from the wafer surface, leaving the nickel silicide film 30 over the gate electrode 16 and the source and drain regions 20.

Figure 5:
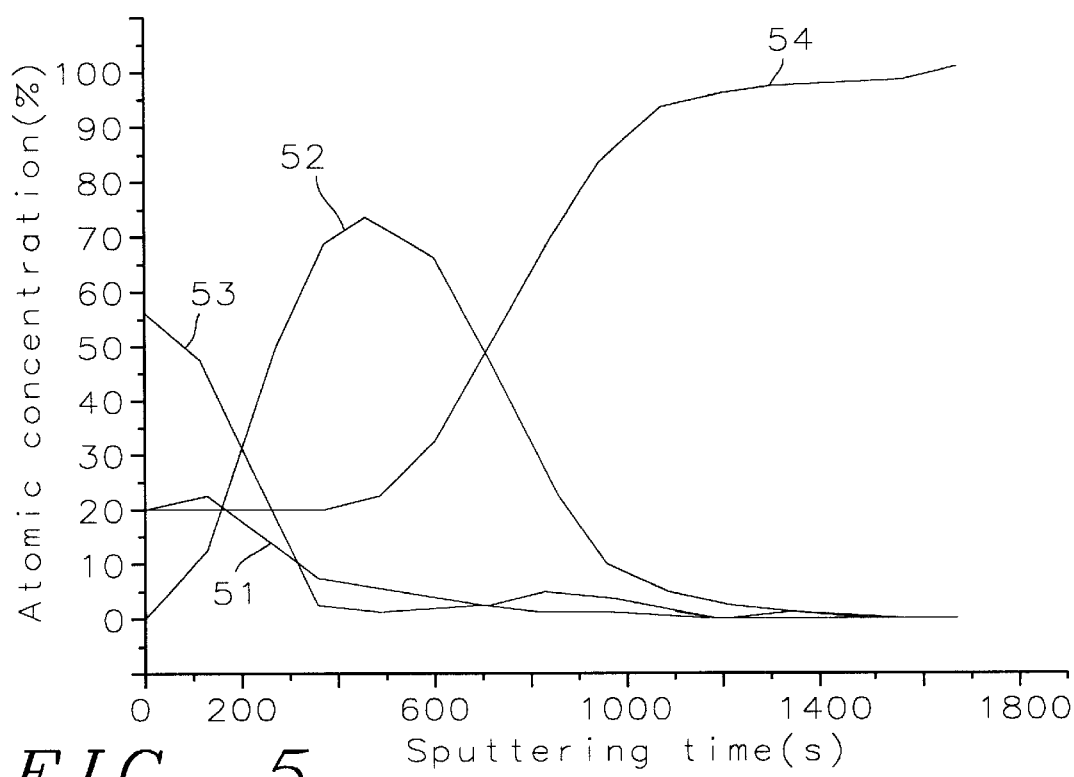
FIGS. 5 and 6 graphically illustrate depth profiles of film stacks of the present invention.
Figure 6:
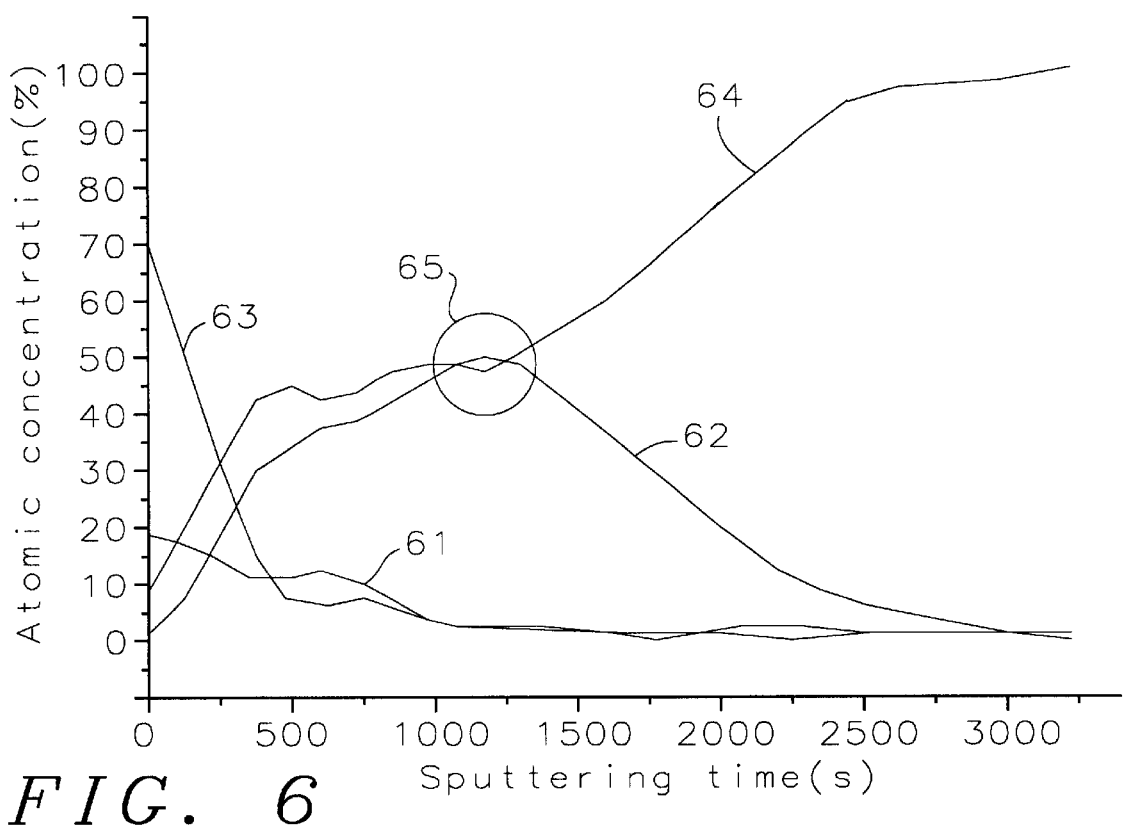

FIGS. 5 and 6 graphically illustrate the atomic concentration of titanium (lines 51, 61), nickel (lines 52, 62), oxygen (lines 53, 63), and silicon (lines 54, 64) as a function of sputtering time (removal of the titanium capping layer). The layers of nickel or nickel silicide form above the silicon substrate. When the sputtering eventually reaches the silicon substrate, the concentration of nickel will decrease to almost 0% and the concentration of silicon will increase to almost 100%.

FIG. 5 illustrates the atomic concentration of the four elements in the case where a 50 Angstrom titanium capping layer is formed over a nickel layer. A native silicon oxide underlies the nickel and overlies the silicon substrate. FIG. 6 illustrates the same stack except that the titanium capping layer is formed to a thickness of 100 Angstroms. In both cases, the wafer is annealed in a rapid thermal process at 700° C. for one minute. FIG. 5 illustrates the inter-diffusion of the titanium capping layer through the nickel layer. This is shown by the drop in titanium concentration at the surface and spread in the titanium concentration. Nickel silicide does not form because of the presence of the native oxide that has not reacted with the titanium.

FIG. 6 shows that with a titanium capping layer of 100 Angstroms, nickel silicide is able to form. At the region 65 between the sputtering time of 500 and 1200 seconds, there is a distinct layer whereby the atomic concentration ratio of Ni:Si is 1:1. This shows that the nickel was able to diffuse through the titanium oxide membrane toward the silicon.

While titanium alone may not be an effective diffusion barrier to ambient oxygen, titanium nitride is a better diffusion barrier. In a second preferred embodiment of the present invention, a double capping layer is deposited over the nickel layer.

Figure 7:
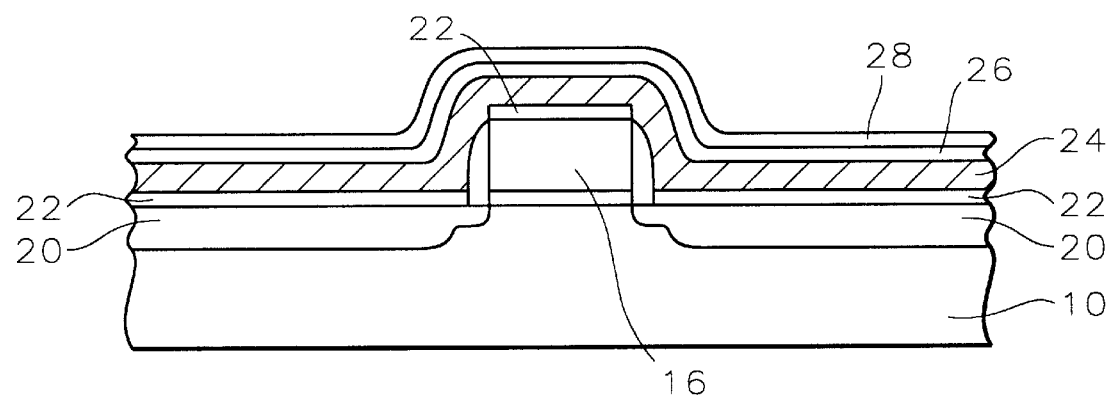
FIG. 7 schematically illustrates in cross-sectional representation a second preferred embodiment of the present invention.

As shown in FIG. 7, the nickel layer 24 has been deposited over the substrate. The underlying native oxide layer 22 is shown. Now a first layer of titanium 26 is deposited over the nickel by physical vapor deposition (PVD) or chemical vapor deposition (CVD) to a thickness of between about 30 and 300 Angstroms. A second layer of titanium nitride 28 is deposited over the titanium layer by PVD or CVD to a thickness of between about 30 and 300 Angstroms.

The oxygen from the atmosphere will react with some of the titanium nitride film to form titanium oxynitride (TiON) on the surface of the film 28. With the oxygen trapped by the titanium nitride layer 28, all of the titanium in layer 26 is free to diffuse through the nickel to combine with the native oxide and form titanium oxide during annealing. As in the first embodiment, nickel silicide is formed over the gate and source/drain regions, using an RTA of preferably between 550 to 600° C. The unreacted nickel and the titanium/titanium nitride bi-layer is removed, leaving the silicided areas 30, as shown in FIG. 4.

Figure 8:
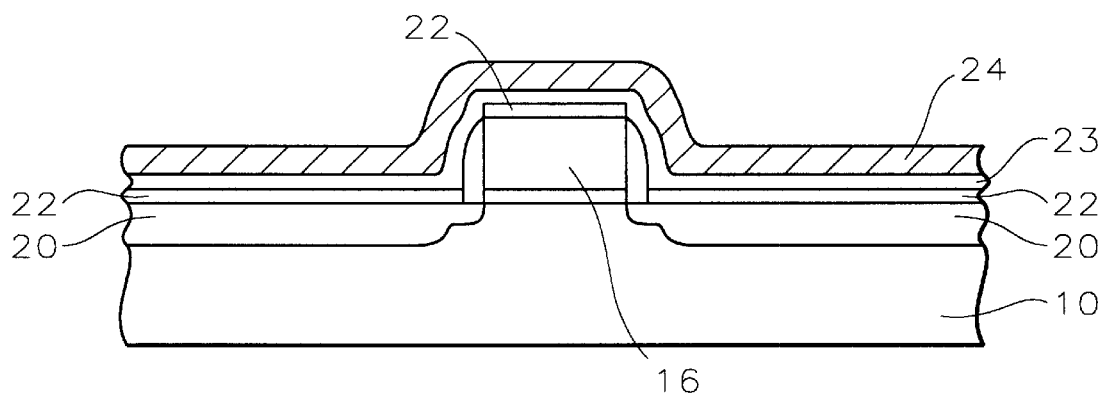
FIG. 8 schematically illustrates in cross-sectional representation a third preferred embodiment of the present invention.

In a third preferred embodiment of the invention, before the nickel layer is deposited, at least one monolayer of titanium is deposited over the substrate or native oxide 22 using atomic layer chemical vapor deposition (ALCVD). FIG. 8 illustrates the monolayer of titanium 23 over the native oxide layer 22. The monolayer 23 is greatly exaggerated in thickness for illustration purposes. Preferably within the same equipment and without breaking vacuum, a layer of nickel 24 is deposited over the titanium monolayer 23. It is desired not to expose the titanium monolayer to air because it will be converted to titanium oxide upon exposure. The titanium monolayer(s) will react with the native oxide to form titanium oxide, a diffusion membrane through which the nickel can diffuse toward the silicon.

Figure 9:
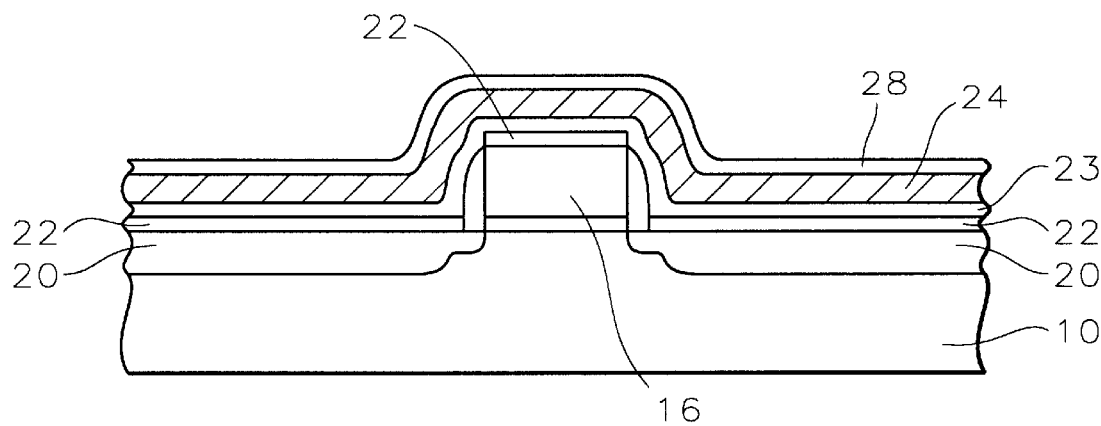
FIG. 9 schematically illustrates in cross-sectional representation a fourth preferred embodiment of the present invention.

In a fourth preferred embodiment of the present invention, a titanium monolayer 23 is deposited underlying the nickel layer 24 as in the third embodiment. As illustrated in FIG. 9, after the nickel layer is deposited, a titanium nitride capping layer 28 is deposited over the nickel layer. This capping layer will prevent oxidation of the nickel before and during RTA.

In both the third and fourth embodiments, nickel silicide is formed over the gate and source/drain regions by RTA at a temperature of between about 450 and 650° C., and preferably 550 to 600° C. The unreacted nickel and titanium nitride layer, in the fourth embodiment, are removed, leaving the silicided areas 30, as shown in FIG. 4. The native oxide layer has reacted with the titanium and been converted to titanium oxide. The titanium oxide layer is pushed up to the surface by the nickel silicide formation.

Figure 10:
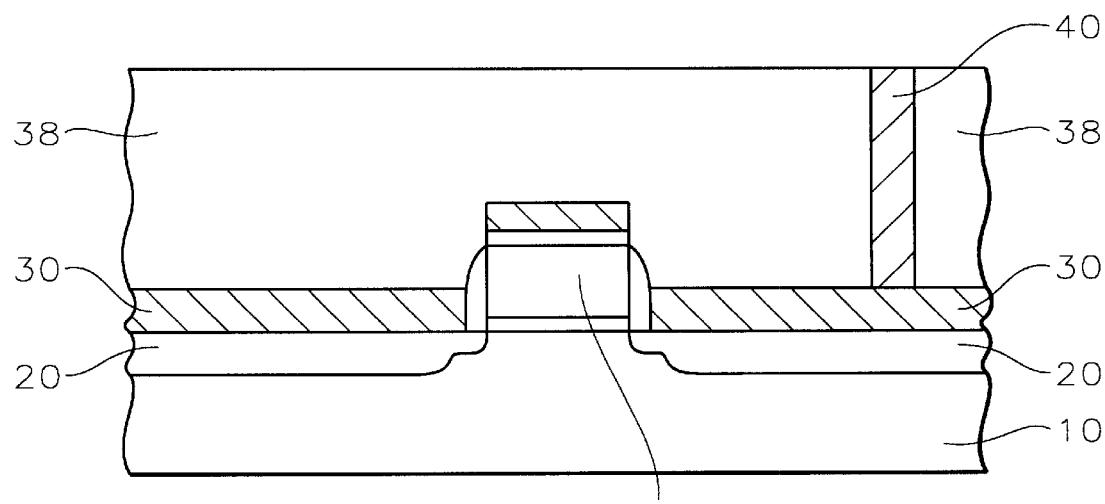
FIG. 10 schematically illustrates in cross-sectional representation a completed integrated circuit manufactured according to the process of the present invention.

Standard backend processing continues as is conventional to complete the integrated circuit. For example, FIG. 10 shows the silicided gate and source/drain regions 30 covered by a thick dielectric layer 38. Electrical connections may be made, for example, to one of the silicided source/drain regions 20 by metal contact 40, as shown.

The process of the invention provides an effective method of forming a high quality nickel silicide film in the presence of native oxide. This saves manufacturing costs because the wafers need not return to cleaning equipment to remove the native oxide before silicidation.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a nickel silicide film in the manufacture of an integrated circuit comprising:

providing a semiconductor substrate having silicon regions to be silicided;

depositing a nickel layer overlying said silicon regions to be silicided wherein a native oxide layer forms on said silicon regions underlying said nickel layer;

depositing a titanium layer overlying said nickel layer;

annealing said substrate whereby titanium atoms from said titanium layer diffuse through said nickel layer and react with said native oxide layer forming a titanium oxide layer whereby said nickel diffuses through said titanium oxide layer into said silicon regions thereby transforming said nickel to nickel silicide where it overlies said silicon regions and wherein said nickel not overlying said silicon regions is unreacted; and removing said unreacted nickel layer to complete formation of said nickel silicide film in the manufacture of said integrated circuit.

2. The method according to claim 1 wherein said silicon regions to be silicided comprise gate electrodes and associated source and drain regions.

3. The method according to claim 1 wherein said nickel layer is sputter deposited to a thickness of between about 100 and 500 Angstroms.

4. The method according to claim 1 wherein said native oxide layer has a thickness of between about 10 and 30 Angstroms.

5. The method according to claim 1 wherein said titanium layer has a thickness of between about 55 and 200 Angstroms.

6. The method according to claim 1 further comprising depositing a titanium nitride layer overlying said titanium layer wherein said titanium layer has a thickness of between about 30 and 300 Angstroms and said titanium nitride layer has a thickness of between about 30 and 300 Angstroms and wherein said titanium nitride layer traps atmospheric oxygen leaving said titanium atoms from said titanium layer to diffuse through said nickel layer.

7. The method according to claim 1 wherein said step of annealing said substrate comprises a rapid thermal annealing at between about 450 and 650° C.

8. A method of fabricating a nickel silicide film in the manufacture of an integrated circuit comprising:

providing a semiconductor substrate having silicon regions to be silicided;

depositing a monolayer of titanium overlying said silicon regions to be silicided wherein a native oxide layer forms on said silicon regions underlying said titanium monolayer;

depositing a nickel layer overlying said titanium monolayer;

annealing said substrate whereby titanium atoms from said titanium monolayer react with said native oxide layer to form titanium oxide and whereby said nickel diffuses through said titanium oxide and is transformed to nickel silicide where it overlies said silicon regions and wherein said nickel not overlying said silicon regions is unreacted; and removing said unreacted nickel layer to complete formation of said nickel silicide film in the manufacture of said integrated circuit.

9. The method according to claim 8 wherein said silicon regions to be silicided comprise gate electrodes and associated source and drain regions.

10. The method according to claim 8 wherein said titanium monolayer is deposited by atomic layer chemical vapor deposition.

11. The method according to claim 8 wherein said native oxide layer has a thickness of between about 10 and 30 Angstroms.

12. The method according to claim 8 wherein said nickel layer is sputter deposited to a thickness of between about 100 and 500 Angstroms.

13. The method according to claim 8 wherein said step of depositing said nickel layer is performed immediately after said step of depositing said titanium monolayer and without a break in vacuum between said steps.

14. The method according to claim 8 further comprising depositing a titanium nitride layer overlying said nickel layer wherein said titanium nitride layer has a thickness of between about 30 and 300 Angstroms and wherein said titanium nitride layer traps atmospheric oxygen.

15. The method according to claim 8 wherein said step of annealing said substrate comprises a rapid thermal annealing at between about 450 and 650° C.

16. A method of fabricating a nickel silicide film in the manufacture of an integrated circuit comprising:

providing a semiconductor substrate having silicon regions to be silicided wherein a native oxide layer forms on said silicon regions;

depositing a monolayer of titanium by atomic layer chemical vapor deposition overlying said silicon regions to be silicided;

thereafter, without a break in vacuum, depositing a nickel layer overlying said titanium monolayer;

annealing said substrate whereby titanium atoms from said titanium monolayer react with said native oxide layer to form titanium oxide and whereby said nickel diffuses through said titanium oxide and is transformed to nickel silicide where it overlies said silicon regions and wherein said nickel not overlying said silicon regions is unreacted; and removing said unreacted nickel layer to complete formation of said nickel silicide film in the manufacture of said integrated circuit.

17. The method according to claim 16 wherein said silicon regions to be silicided comprise gate electrodes and associated source and drain regions.

18. The method according to claim 16 wherein said native oxide layer has a thickness of between about 10 and 30 Angstroms.

19. The method according to claim 16 wherein said titanium monolayer is deposited by atomic layer chemical vapor deposition.

20. The method according to claim 16 wherein said nickel layer is sputter deposited to a thickness of between about 100 and 500 Angstroms.

21. The method according to claim 16 further comprising depositing a titanium nitride layer overlying said nickel layer wherein said titanium nitride layer has a thickness of between about 30 and 300 Angstroms and wherein said titanium nitride layer traps atmospheric oxygen.

22. The method according to claim 16 wherein said step of annealing said substrate comprises a rapid thermal annealing at between about 450 and 650° C.

* * * * *